(12) United States Patent
Delorme et al.

(10) Patent No.: US 6,965,267 B2
(45) Date of Patent: Nov. 15, 2005

(54) BIPOLAR DIFFERENTIAL INPUT STAGE WITH INPUT BIAS CURRENT CANCELLATION CIRCUIT

(75) Inventors: Emmanuel Delorme, Palo Alto, CA (US); Paul Henneuse, North Fork, CA (US)

(73) Assignee: Analog Devices, Inc., Norwood, MA (US)

( * ) Notice: Subject to any disclaimer, the term of this patent is extended or adjusted under 35 U.S.C. 154(b) by 61 days.

(21) Appl. No.: 10/789,738

(22) Filed: Feb. 27, 2004

(65) Prior Publication Data

US 2005/0189992 A1 Sep. 1, 2005

(51) Int. Cl.[7] .............................. H03F 3/45; H03L 5/00
(52) U.S. Cl. ...................... 330/257; 330/261; 330/296; 327/589; 327/478
(58) Field of Search ................................ 330/257, 261, 330/258, 259, 296, 25; 327/589, 478, 108

(56) References Cited

U.S. PATENT DOCUMENTS

| | | | |
|---|---|---|---|
| 3,714,600 A * | 1/1973 | Kujik et al. ................. | 330/257 |
| 4,575,658 A * | 3/1986 | Kay ........................ | 315/111.21 |
| 4,575,685 A | 3/1986 | Dobkin et al. .............. | 330/261 |
| 4,639,684 A * | 1/1987 | Laude ........................ | 330/257 |
| 4,755,770 A * | 7/1988 | Groom et al. ............... | 330/296 |
| 4,780,688 A * | 10/1988 | Groom ........................ | 330/261 |
| 4,843,342 A * | 6/1989 | Hester et al. ................ | 330/257 |
| 5,812,028 A * | 9/1998 | Adachi et al. ............... | 330/261 |
| 6,469,578 B1 * | 10/2002 | Smith ........................ | 330/252 |
| 6,549,072 B1 * | 4/2003 | Vernon ........................ | 330/257 |
| 6,636,111 B1 | 10/2003 | Gross et al. ................. | 327/589 |

OTHER PUBLICATIONS

Linear Technology, Dual/Quad 135μA, 14Nv/Hz, Rail-to-Rail Output Precision Op Amp, LT6011/LT6012, p. 1–16, no month, no year.

* cited by examiner

*Primary Examiner*—Lam T. Mai
(74) *Attorney, Agent, or Firm*—Koppel, Jacobs, Patrick & Heybl

(57) ABSTRACT

A bipolar differential input stage with an input bias current cancellation circuit comprises an input pair and a bipolar tracking transistor. The input stage is arranged such that the collector currents in the input pair and tracking transistor, and the collector-emitter voltages of the input pair and tracking transistor, are substantially equal. A lateral PNP transistor's first collector provides the tracking transistor base current required to achieve the substantially equal collector current, and second and third collectors provide copies of the tracking transistor base current as bias current cancellation currents to the bases of the input pair, thereby reducing the input stages' input bias currents.

20 Claims, 3 Drawing Sheets

US 6,965,267 B2

BIPOLAR DIFFERENTIAL INPUT STAGE WITH INPUT BIAS CURRENT CANCELLATION CIRCUIT

BACKGROUND OF THE INVENTION

1. Field of the Invention

This invention relates to the field of operational amplifiers (op amps), comparators, instrumentation amplifiers, and the like, and particularly to circuits designed to reduce the input bias currents in such circuits.

2. Description of the Related Art

Ideally, the input stage of a bipolar circuit such as an op amp, comparator, or an instrumentation amplifier has an input bias current $I_B$—i.e., the amount of current which flows into or out of the circuit's input terminals—of zero. This is because the resolution of the input stage increases with a decreasing $I_B$. For example, assume that the output current $I_D$ of a photodiode is to be amplified by an op amp configured as an inverting amplifier, with a feedback resistance R. The op amp's output voltage $V_{out}$ will be given by $(I_D-I_B)/R$; i.e., the amount of photodiode current converted into an output voltage by the op amp is reduced by the magnitude of the op amp's input bias current.

The input bias current $I_B$ of a bipolar input stage is non-zero because the stage's inputs are the bases of two bipolar transistors, arranged as a differential pair. The base current of each input transistor is determined by its collector current $I_C$ and its beta value ($\beta$), with $I_B=I_C/\beta$. One approach to reducing $I_B$ is to use input transistors with very high betas, known as "superbeta" transistors. However, though the use of a superbeta input pair can significantly reduce $I_B$, it cannot eliminate it—and as such, the input bias currents and input current resolution will still be less than ideal.

Another approach is shown in FIG. 1. Here, bipolar input transistors Q1 and Q2 form a differential input pair. The common emitters of Q1 and Q2 are connected to a bias current source 10, and their collectors are coupled to respective biasing transistors Q3 and Q4. A "tracking" transistor Q5 is connected in series between Q1 and Q3, and another tracking transistor Q6 is connected in series between Q2 and Q4, such that the collector-emitter circuits of Q5 and Q6 conduct the collector currents of Q1 and Q2, respectively. This results in the base currents of Q5 and Q6 tracking those of Q1 and Q2, respectively. Lateral PNP transistors Q7 and Q8 are connected to mirror the base currents of Q5 and Q6 to the bases of Q1 and Q2, respectively. Ideally, these mirrored currents effectively cancel the input bias currents of Q1 and Q2. However, due to current leakage from the base of each of the lateral PNP transistors, the collector currents of Q7 and Q8 may not accurately track the base currents of Q5 and Q6, and, hence, may not accurately cancel the bias currents of their associated input transistors.

U.S. Pat. No. 4,575,685 to Dobkin et al. is designed to overcome the leakage current problem noted above, by employing circuitry including a tracking transistor which is virtually independent of the presence or absence of leakage current. To make the tracking transistor's base current equal to that of the input transistors, the patent employs a scheme to make the collector-emitter voltages of the input and tracking transistors equal. However, the scheme used is subject to process variations that might result in unequal collector-emitter voltages, and a consequent lack of accuracy in the cancellation currents.

SUMMARY OF THE INVENTION

A bipolar differential input stage with an input bias current cancellation circuit is presented which overcomes the problems noted above, reducing input bias currents down to the picoampere level.

The present invention comprises a bipolar differential input stage, with the input pair's bases connected to respective input terminals and their emitters connected together at a common emitter node; a first current source connected to the common emitter node provides a first bias current to the input pair, such that the pair transistors conduct respective output currents in response to a differential input signal applied to the input terminals. The invention also includes a bipolar tracking transistor, and a second current source which provides a second bias current to the tracking transistor. The input stage is arranged such that the collector currents in the input pair and tracking transistor, and the collector-emitter voltages of the input pair and tracking transistor, are substantially equal. This causes the tracking transistor's base current to track the base currents of the input pair.

Input bias currents are cancelled using a base current copy circuit. The copy circuit provides the tracking transistor base current required to achieve the substantially equal collector current in the tracking transistor, and replicates the base current to provide first and second bias current cancellation currents to the bases of the input pair. Since the tracking transistor base current tracks the base current of the input pair, the bias current cancellation currents will be substantially equal to the input bias currents of the input pair—and as such will reduce the input stages' input bias currents.

The base current copy circuit is preferably implemented with a lateral PNP transistor, having respective collectors connected to the bases of the tracking transistor and the input transistors, and biased such that it provides currents to the input pair bases which are approximately equal to the tracking transistor's base current. When so arranged, the currents provided to the input pair bases will serve as cancellation currents which substantially reduce the input stages' input bias currents.

Further features and advantages of the invention will be apparent to those skilled in the art from the following detailed description, taken together with the accompanying drawings

DETAILED DESCRIPTION OF THE INVENTION

Figure 1:
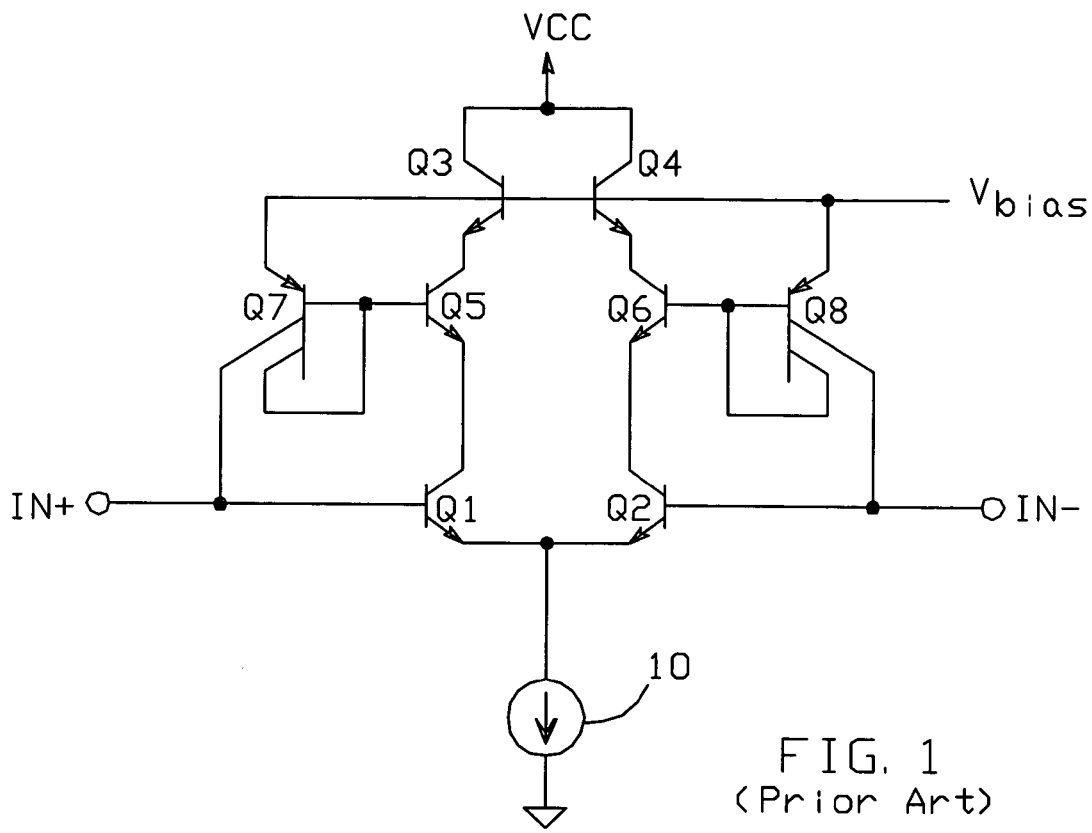
FIG. 1 is a schematic diagram of a known bipolar input stage and input bias current cancellation scheme.
Figure 2:
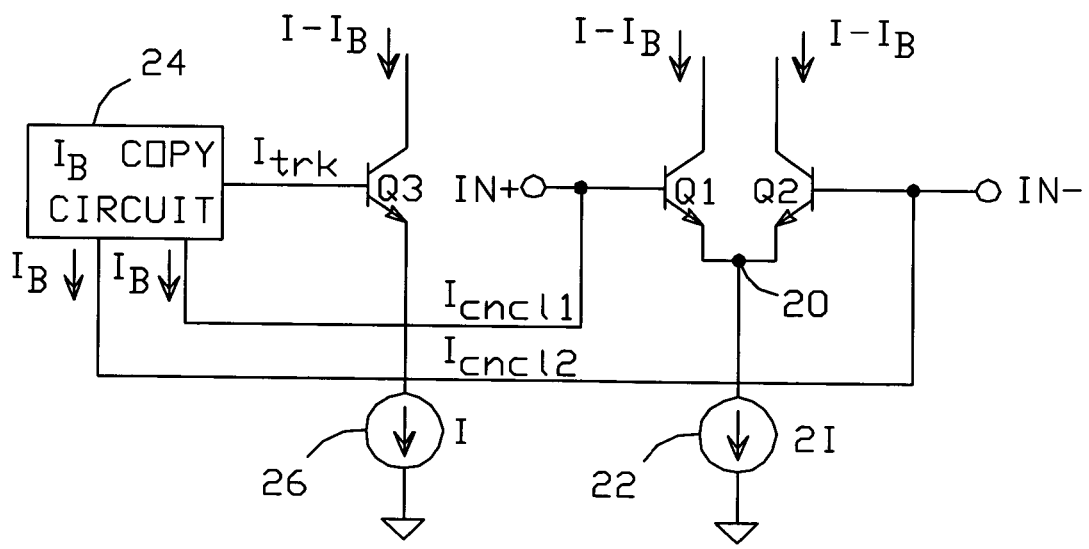
FIG. 2 is a block/schematic diagram illustrating the basic principles of a bipolar differential input stage which includes an input bias current cancellation circuit per the present invention.

The basic principles of the present invention are illustrated in FIG. 2. A bipolar differential input pair comprises first and second transistors Q1 and Q2, having their emitters connected to a common emitter node 20 and their bases connected to respective input terminals IN+ and IN−. A first current source 22 is connected to common emitter node 20 and provides bias current to Q1 and Q2 such that they conduct respective output currents in response to a differential input signal applied to IN+ and IN−.

The invention includes circuitry for reducing the input bias currents of Q1 and Q2. This circuitry includes a tracking transistor Q3 and a base current copy circuit 24. A current source 26 provides bias current to Q3.

The first and second current sources are arranged such that second current source 26 provides a bias current I, and first current source 22 provides a bias current 2*I. Then, when IN+ and IN− are equal, Q1 and Q2 each conduct currents I−$I_B$, where $I_B$ is the base current of Q1 and Q2. Currents $I_B$ are the input bias currents which the present invention is intended to reduce or cancel.

Circuitry (not shown) provides current to the collector of tracking transistor Q3 such that Q3 also conducts a current I−$I_B$, where $I_B$ is the base current of Q3. The input stage is also arranged to ensure that the collector-emitter voltages of Q1, Q2 and Q3 are substantially equal. With Q1–Q3 having equal collector currents and equal collector-emitter voltages (when IN+≈IN−), Q3's base current will be substantially equal to that of Q1 and Q2.

Q3's base current is defined by its collector current and its collector-emitter voltage. Base current copy circuit 24 is arranged to provide the base current $I_{trk}$ to tracking transistor Q3 required to make its collector current equal to those in Q1 and Q2. Copy circuit 24 replicates $I_{trk}$ and provides the copies as first and second bias current cancellation currents $I_{cncl1}$, $I_{cncl2}$ to the bases of Q1 and Q2, respectively, such that $I_{cncl1} \approx I_{cncl2} \approx I_{trk} \approx I_B$. By providing cancellation currents to the bases of Q1 and Q2 which are substantially equal to the input bias currents of Q1 and Q2, the input stages' input bias currents are substantially reduced.

Making the collector currents and collector-emitter voltages of Q1–Q3 substantially equal reduces cancellation current inaccuracies that might arise due to the Early effect, and ensures that the base current of Q3 will equal those of Q1 and Q2 with a high degree of precision. Under these conditions, when the base current of Q3 is copied to the bases of Q1 and Q2, the input pairs' input bias currents can be reduced down to the picoampere level. Q1–Q3 are preferably superbeta transistors, which inherently reduce the base current needed for a particular collector current, and thus serve to further reduce the input pairs' input bias currents. For best results, Q1–Q3 should have matching characteristics—particularly with respect to emitter size, temperature coefficient, and beta.

Note that, when the input pair collector currents are unequal, their base currents are also unequal. As the present bias current cancellation scheme provides equal cancellation currents to both input devices, there will therefore be some inaccuracy in the cancellation currents when the input pair collector currents are unequal.

Figure 3:
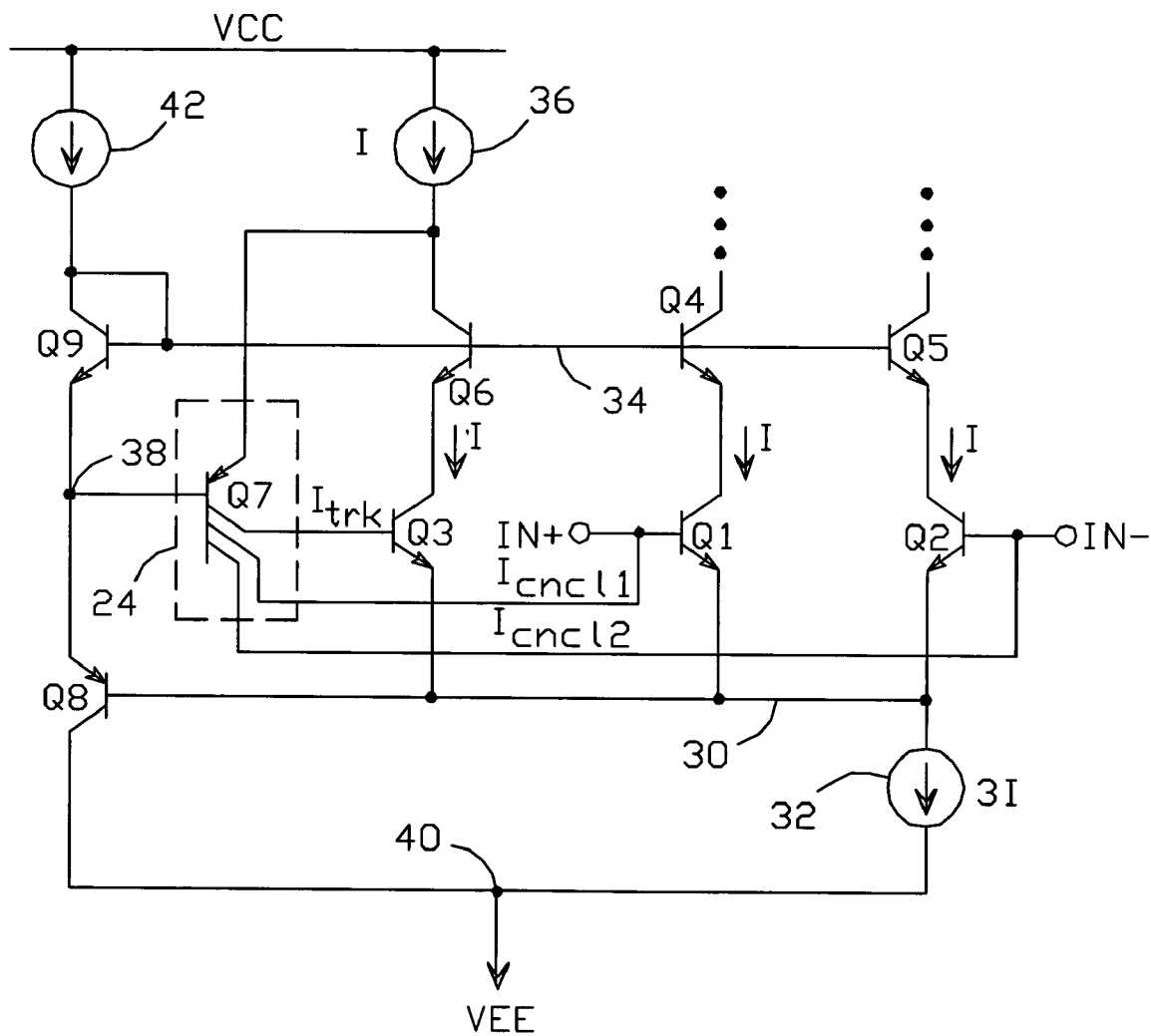
FIG. 3 is a schematic of a preferred embodiment of the present invention.

A preferred embodiment of the present invention is shown in FIG. 3. As before, Q1 and Q2 form a bipolar differential input pair, connected to input terminals IN+ and IN−, respectively. Their emitters are connected to a common emitter node 30. A current source 32 is connected to node 30 to provide bias current to Q1 and Q2.

The collectors of Q1 and Q2 are connected to the emitters of respective cascode transistors Q4 and Q5, with the bases of Q4 and Q5 connected together at a node 34; the collectors of Q4 and Q5 are coupled to a supply voltage VCC (connection to VCC not shown). When so arranged, cascode transistors Q4 and Q5 conduct the collector currents of Q1 and Q2, respectively.

In this embodiment, tracking transistor Q3 has its emitter connected to common emitter node 30 such that it is biased by current source 32. Q3's collector is connected to the collector-emitter circuit of a cascode transistor Q6 having its base connected to node 32, such that Q6 conducts Q3's collector current.

Current source 32 is arranged to provide a bias current given by 3*I to common emitter node 30, and a current source 36 is arranged to provide a current I to the collector of cascode transistor Q6. When so arranged, when IN+≈IN−, Q1, Q2 and Q3 each conduct a substantially equal current I.

Base current copy circuit 24 is implemented with a lateral PNP transistor Q7, having a first collector connected to the base of tracking transistor Q3, a second collector connected to the base of Q1, and a third collector connected to the base of Q2. Q7 must be biased to operate in its linear region—i.e., with its emitter-base junction forward-biased and its base-collector junction reverse-biased—so that the current provided to Q3 via Q7's first collector is replicated on its second and third collectors.

One way of biasing Q7 as specified above is shown in FIG. 3. The base of Q7 is connected to a node 38. A PNP transistor Q8 has its collector-emitter circuit connected between node 38 and a circuit common point 40, typically the negative supply (VEE). A current source 42 and a diode-connected NPN transistor Q9 are connected in series between supply voltage VCC and node 38. The emitter of Q7 is connected to the collector of Q6. This arrangement ensures that the voltages at Q7's base and emitter are such that its emitter-base junction is forward-biased, and that the voltages at Q7's base and collector are such that its collector-base junction is reverse-biased. This remains true even if the input common mode voltage changes, since node 38 varies with input common mode voltage, and the collector of Q6 is a floating, high impedance node.

The presence of diode-connected Q9 also ensures that node 34 is one base-emitter voltage above the input common mode voltage, to keep the base-collector voltages of Q1–Q3 equal to zero. This protects superbeta devices, which tend to have low base-collector breakdown voltages.

As noted above, when IN+≈IN−, the arrangement of current sources 32 and 36 cause Q1, Q2, and Q3 to have substantially equal collector currents I. Because the bases of cascode transistors Q4, Q5 and Q6 are all connected together at node 34, the collectors of Q1–Q3 will be at equal voltages—one base-emitter junction voltage below node 34. The emitters of Q1–Q3 are connected together at common emitter node 30. As a result, the collector-emitter voltages of Q1, Q2 and Q3 will be substantially equal. As noted above, making the collector currents and collector-emitter voltages of Q1–Q3 substantially equal reduces inaccuracies that might arise due to the Early effect, and ensures that the base current of Q3 will equal those of Q1 and Q2 with a high degree of precision.

Lateral PNP transistor Q7 is connected to provide base current ($I_{trk}$) to tracking transistor Q3 via its first collector. Q7 replicates current $I_{trk}$ to the bases of Q1 and Q2 (as cancellation currents $I_{cncl1}$ and $I_{cncl2}$) via its second and third collectors, respectively. Since $I_{trk}$ is substantially equal to the base currents of Q1 and Q2, and $I_{cncl1} \approx I_{cncl2} \approx I_{trk}$, $I_{cncl1}$ and $I_{cncl2}$ will substantially reduce the input bias currents of Q1 and Q2, respectively.

Figure 4:
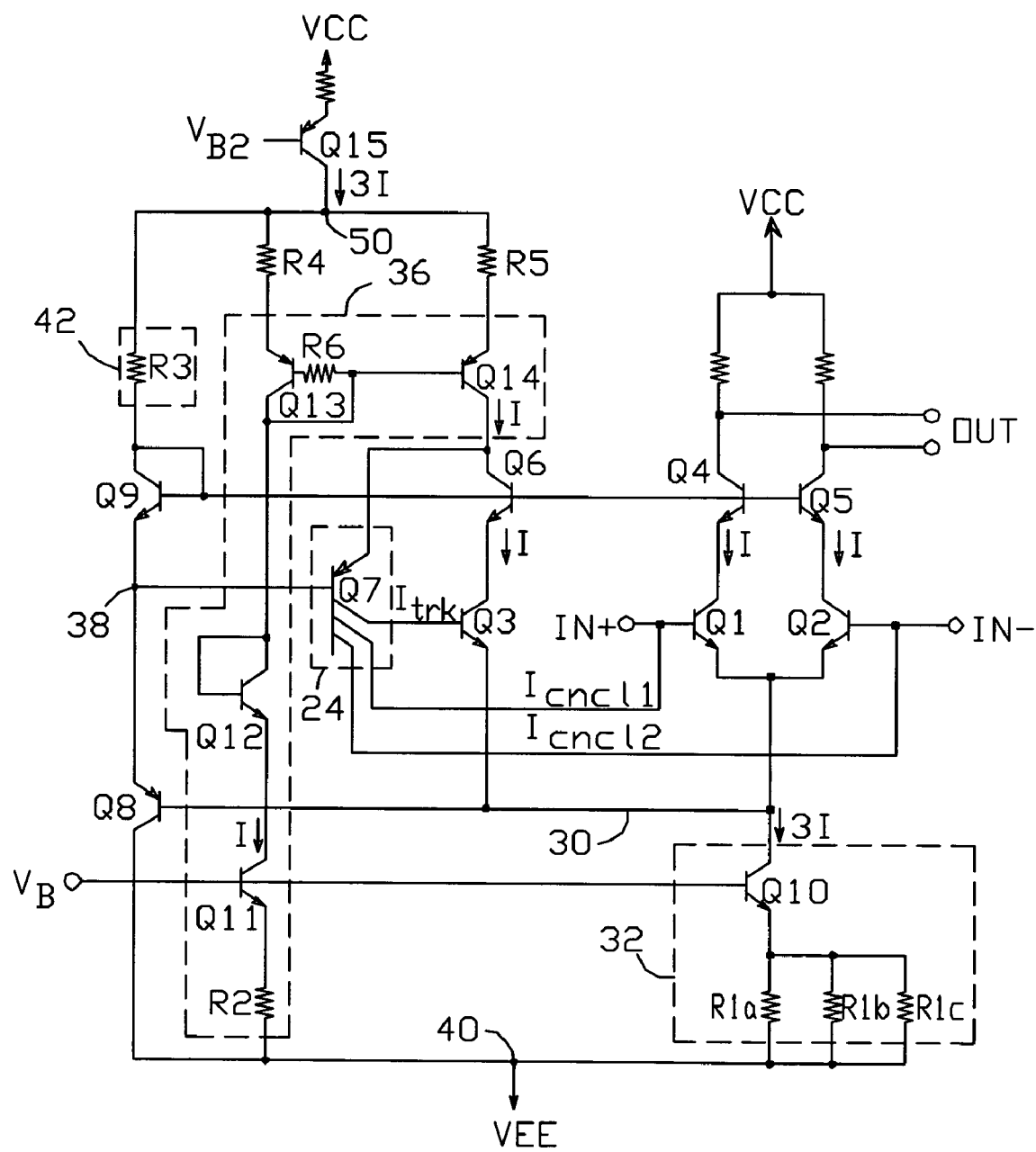
FIG. 4 is a more detailed schematic of a preferred embodiment of per the present invention.

A more detailed schematic of the preferred embodiment of the invention is shown in FIG. 4. Here, current source 32 is implemented with a NPN transistor Q10 with an emitter resistor R1; R1 may be implemented with a single resistor or 3 resistors (R1a, R1b, R1c), preferably of equal resistance, connected in parallel. Current source 36 is preferably implemented with a transistor Q11 having its emitter coupled to circuit common point 40 via a resistor R2; the bases of Q11 and Q10 are connected together and to a common bias voltage $V_B$. A diode-connected NPN transistor Q12 is connected between the collector of Q11 and a current mirror made from a diode-connected PNP transistor Q13 and a PNP transistor Q14.

The resistance of resistor R2 is preferably three times greater than that of R1 (or equal to that of R1a, R1b and R1c when R1a=R1b=R1c), and the ratio of Q10's emitter size to that of Q11 is preferably 3:1. When so arranged, current source 32 provides a bias current given by 3*I and Q11 conducts a current I. Q11's current I is mirrored by the Q13/Q14 current mirror to the collector of Q6, thereby ensuring that, when IN+≈IN−, tracking transistor Q3 has a collector current I equal to the collector currents of Q1 and Q2.

Current source 42 is here replaced with a resistor R3 connected between Q9 and a node 50, and Q13 and Q14 are connected to node 50 via respective resistors R4 and R5. Node 50 is connected to supply voltage VCC via a PNP transistor Q15. Q15 is biased with a bias voltage $V_{B2}$ such that it acts as a current source which outputs a current 3*I. It provides 2*I to the Q13/Q14 current mirror, with the rest of the current (3I−2I=I) provided to R3. R3 is needed to ensure enough headroom for the Q13/Q14 current mirror.

Q15 also serves to decouple the input bias current cancellation circuit from VCC. Because of Q15, the voltage at node 50 can vary with the input common mode voltage. As such, the biasing of the cancellation circuit's devices does not change with a change of the input common mode voltage. If node 50 was connected directly to VCC, the cancellation scheme would be input common mode voltage dependant.

When arranged as shown in FIG. 4, a voltage loop is formed between the collector of Q10 and the collector of Q11, via the base-emitter junctions of Q8 and Q9, R3, R4, and the base-emitter junctions of Q13 and Q12. This loop makes the collector voltages of Q10 and Q11 approximately equal, and enables them to vary equally with a varying input common mode voltage. For example, if the input common mode voltage decreases, the voltage loop ensures that the collector-emitter voltages across Q10 and Q11 are reduced by equal amounts, as are their collector currents. Therefore, the 3:1 ratio between the collector currents is kept constant for a changing input common mode voltage, which prevents cancellation current errors from being introduced due to the Early effect when the input common mode voltage changes.

Transistor Q12 enables the collector voltage of Q11 to be approximately equal to the collector voltage of Q10. This is achieved by making the following relationship true: $V_{be(Q8)}+V_{be(Q9)}+I*R3=I*R4+V_{be(Q13)}+V_{be(Q12)}$. If Q12 is omitted, the collector voltage of Q11 will be different from that of Q10, which would show up as an error in the matching of Q1–Q3 collector currents. Including Q12 reduces the systematic error, before trim, of the input bias current cancellation.

Mirror transistor Q13 preferably includes a resistor R6 connected between its collector and base. This serves to overdrive mirror transistor Q14 and thereby compensate for the emitter current of Q7 which is diverted from the collector of Q6 (and therefore Q3).

The present input stage and input bias current cancellation circuit can be employed in numerous applications which use a bipolar differential input stage. Examples of such applications include op amps, comparators, and instrumentation amplifiers.

When arranged as described herein (including using superbeta transistors for Q1–Q3), a significant reduction in input bias current can be achieved; i.e., a typical base current of ~15 μA is reduced to ~0.3 μA/β, where β is the beta value of the input pair and tracking transistor. For example, if Q1, Q2 and Q3 are each superbeta transistors with a β of 3000, the input stage's input bias current will be reduced to about 100 pA. This greatly improves the input stage's input current resolution, which can be particularly advantageous when coupled to small input current such as that produced by a photodiode. This improvement is achieved without the need to perform a final resistor trim step. Additional input bias current reduction can be achieved with the addition of a trim step that trims the resistance values of resistors R4 and/or R5 in FIG. 4, which adjusts the magnitude of the current through tracking transistor Q3. Note that Q3's current can be increased or decreased, depending on whether R4 or R5 is trimmed.

While particular embodiments of the invention have been shown and described, numerous variations and alternate embodiments will occur to those skilled in the art. Accordingly, it is intended that the invention be limited only in terms of the appended claims.

We claim:

1. A bipolar differential input stage which includes an input bias current cancellation circuit, comprising:
   first and second bipolar input transistors having their bases connected to first and second input terminals, respectively, and their emitters connected together at a common emitter node;
   a first current source connected to said common emitter node and arranged to provide a first bias current $I_{bias1}$ to said first and second input transistors;
   a bipolar tracking transistor;
   a second current source which provides a second bias current $I_{bias2}$ to said tracking transistor;
   said input stage arranged such that the collector currents in and the collector-emitter voltages of said first and second input transistors and said tracking transistor are substantially equal when the voltages at said first and second input terminals are equal; and
   a base current copy circuit arranged to provide a base current $I_{trk}$ to said tracking transistor required to achieve said substantially equal collector current in said tracking transistor, said copy circuit further arranged to provide first and second bias current cancellation currents $I_{cncl1}$, $I_{cncl2}$ to the bases of said first and second input transistors, respectively, such that $I_{cncl1} \approx I_{cncl2} \approx I_{trk}$, thereby reducing the input stages' input bias currents.

2. The input stage of claim 1, wherein $I_{bias2}$ is substantially equal to $I_{bias1}/2$.

3. The input stage of claim 1, wherein said input stage is the input stage of an operational amplifier.

4. The input stage of claim 1, wherein said input stage is the input stage of a comparator.

5. The input stage of claim 1, wherein said input stage is the input stage of an instrumentation amplifier.

6. A bipolar differential input stage which includes an input bias current-cancellation circuit, comprising:
   first and second bipolar input transistors (Q1, Q2) having their bases connected to first and second input terminals, respectively, and their emitters connected together at a common emitter node, said first and second transistors biased to conduct respective output currents in response to a differential input signal applied to said first and second input terminals;

first and second bipolar cascode transistors (Q4, Q5) connected in series between said a first supply voltage and said first and second input transistors, respectively, such that said first and second cascode transistors conduct said first and second output currents, the bases of said first and second cascode transistors connected together at a second node;

a bipolar tracking transistor (Q3) having its emitter connected to said common emitter node;

a first current source connected to said common emitter node and arranged to provide a first bias current $I_{bias1}$ at said common emitter node;

a third cascode transistor (Q6) having its base connected to said second node and its collector-emitter circuit connected in series between a second current source and said tracking transistor, said second current source arranged such that said third cascode transistor and said tracking transistor conduct a current given by $I_{bias1}/3$, such that the collector currents in and the collector-emitter voltages across said first and second input transistors and said tracking transistor are substantially equal when the voltages at said first and second input terminals are equal; and a base current copy circuit arranged to provide a base current $I_{trk}$ to said tracking transistor such that it conducts $I_{bias1}/3$, said copy circuit further arranged to provide first and second bias current cancellation currents $I_{cncl1}$, $I_{cncl2}$ to the bases of said first and second input transistors, respectively, such that $I_{cncl1} \approx I_{cncl2} \approx I_{trk}$, thereby reducing the input stages' input bias currents.

7. The input stage of claim 6, wherein said base current copy circuit comprises a lateral PNP transistor (Q7) having first, second and third collectors, said lateral PNP transistor having its first collector connected to the base of said tracking transistor and providing $I_{trk}$, and its second and third collectors connected to the bases of said first and second input transistors and conducting $I_{cncl1}$ and $I_{cncl2}$, respectively, wherein said input range has an associated common mode input voltage range, said lateral PNP transistor connected such that its emitter-base junction is forward-biased and its base-collector junction is reverse-biased such that said lateral PNP transistor operates in its linear region over said common mode input voltage range.

8. The input stage of claim 7, wherein said lateral PNP transistor's emitter is connected to the collector of said third cascode transistor.

9. The input stage of claim 8, further comprising:

a PNP transistor (Q8) having its base connected to said common emitter node, its collector coupled to a second supply voltage, and its emitter connected to a third node; and a diode-connected NPN transistor (Q9) having its base/collector connected to said second node and to a current source 42 coupled to said first supply voltage, and its emitter connected to said third node;

the base of said lateral PNP transistor connected to said third node.

10. The input stage of claim 7, wherein said first current source comprises a first current source transistor (Q10) having its collector connected to said common emitter node, its emitter coupled to a second supply voltage, and its base connected to a bias voltage $V_B$;

said second current source comprising:

a second current source transistor (Q11) having its emitter coupled to said second supply voltage and its base connected to $V_B$, and first and second current sources arranged such that said second current source transistor conducts $I_{bias1}/3$; and a current mirror (Q13/Q14) connected to mirror the current conducted by said second current source transistor to the collector of said third cascode transistor.

11. The input stage of claim 10, wherein said first current source transistor is coupled to said second supply voltage via a first resistance and said second current source transistor is coupled to said second supply voltage via a second resistance, said first resistance made equal to approximately one-third of said second resistance, and the ratio between the emitter size of said first current source transistor and the emitter size of said second current source transistor made to be approximately 3:1.

12. The input stage of claim 10, wherein said input stage provides a voltage loop between the collector of said first current source transistor and the collector of said second current source transistor such that Early effect-induced errors that might otherwise arise when the input stage's common mode input voltage changes are reduced.

13. The input stage of claim 10, wherein said current mirror comprises a diode-connected PNP input transistor (Q13) and a PNP output transistor (Q14), the emitters of said mirror transistors connected to a fourth node via respective resistances (R4/R5), said fourth node coupled to said first supply voltage via the collector-emitter circuit of a PNP transistor (Q15) which receives a bias voltage at its base such that it provides a current approximately equal to $I_{bias1}$ to said fourth node.

14. The input stage of claim 13, further comprising:

a PNP transistor (Q8) having its base connected to said common emitter node, its collector connected to said second supply voltage, and its emitter connected to a third node; and a diode-connected NPN transistor (Q9) having its base/collector connected to said second node and to a resistor (R3), the other side of R3 connected to said fourth node, and its emitter connected to said third node;

said lateral PNP's base connected to said third node, and its emitter connected to the collector of said third cascode transistor;

wherein said second current source further comprises a diode-connected NPN transistor (Q12) connected between said current mirror and said second current source transistor, said input stage thereby providing a voltage loop between the collector of said first current source transistor and the collector of said second current source transistor via the base-emitter junction of Q8, the base-emitter junction of Q9, R3, R4, the base-emitter junction of Q13, and the base-emitter junction of Q12, such that Early effect-induced errors that might otherwise arise when the input stage's common mode input voltage changes are reduced.

15. The input stage of claim 14, wherein said input stage is arranged such that $V_{be(Q8)}+V_{be(Q9)}+I^* R3=I^* R4+V_{be(Q13)}+V_{be(Q12)}$ such that the collector voltage of said first current source transistor is approximately equal to the collector voltage of said second current source transistor.

16. The input stage of claim 14, further comprising a resistor connected between the collector and base of Q13 such that Q13 overdrives mirror transistor Q14 to compensate for the emitter current of said lateral PNP transistor which is diverted from the collector of said third cascode transistor.

17. A bipolar differential input stage which includes an input bias current cancellation circuit, comprising:
- first and second bipolar input transistors (Q1, Q2) having their bases connected to first and second input terminals, respectively, and their emitters connected together at a common emitter node, said first and second transistors biased to conduct respective output currents in response to a differential input signal applied to said first and second input terminals;
- first and second bipolar cascode transistors (Q4, Q5) connected in series between said a first supply voltage and said first and second input transistors, respectively, such that said first and second cascode transistors conduct said first and second output currents, the bases of said first and second cascode transistors connected together at a second node;
- a bipolar tracking transistor (Q3) having its emitter connected to said common emitter node;
- a first current source comprising a first current source transistor (Q10) having its collector connected to said common emitter node, its emitter coupled to a second supply voltage, and its base connected to a bias voltage $V_B$, said first current source arranged to provide a first bias current $I_{bias1}$ at said common emitter node;
- a second current source comprising a second current source transistor (Q11) having its emitter coupled to said second supply voltage and its base connected to $V_B$, said first and second current sources arranged such that said second current source transistor conducts $I_{bias1}/3$;
- a current mirror (Q13/Q14) connected to mirror the current conducted by said second current source transistor to a third node;
- a third cascode transistor (Q6) having its base connected to said second node and its collector-emitter circuit connected in series between said third node and said tracking transistor such that said third cascode transistor and said tracking transistor conduct a current given by $I_{bias1}/3$, such that the collector currents in and the collector-emitter voltages across said first and second input transistors and said tracking transistor are substantially equal when the voltages at said first and second input terminals are equal; and
- a lateral PNP transistor (Q7) having first, second and third collectors, said lateral PNP transistor having its first collector connected to the base of said tracking transistor and providing $I_{trk}$, and its second and third collectors connected to the bases of said first and second input transistors and conducting $I_{cncl1}$ and $I_{cncl2}$ to the bases of said first and second input transistors, respectively, said lateral PNP transistor biased such that its emitter-base junction is forward-biased and its base-collector junction is reverse-biased such that said lateral PNP transistor operates in its linear region and $I_{cncl1} \approx I_{cncl2} \approx I_{trk}$, thereby reducing the input stages' input bias currents.

18. The input stage of claim 17, wherein said input stage provides a voltage loop between the collector of said first current source transistor and the collector of said second current source transistor such that Early effect-induced errors that might otherwise arise when the input common mode voltage changes are reduced.

19. The input stage of claim 18, wherein said current mirror comprises a diode-connected PNP input transistor (Q13) and a PNP output transistor (Q14), the emitters of said mirror transistors connected to a fourth node via respective resistances (R4/R5), said fourth node coupled to said first supply voltage via the collector-emitter circuit of a PNP transistor (Q15) which receives a bias voltage at its base such that it provides a current approximately equal to $I_{bias1}$ to said fourth node, said input stage further comprising:
- a PNP transistor (Q8) having its base connected to said common emitter node, its collector connected to said second supply voltage, and its emitter connected to a fifth node; and
- a diode-connected NPN transistor (Q9) having its base/collector connected to said second node and to a resistor (R3), the other side of R3 connected to said fourth node, and its emitter connected to said fifth node;
- said lateral PNP's base connected to said fifth node, and its emitter connected to the collector of said third cascode transistor;
- wherein said second current source further comprises a diode-connected NPN transistor (Q12) connected between said current mirror and said second current source transistor, said input stage thereby providing said voltage loop between the collector of said first current source transistor and the collector of said second current source transistor via the base-emitter junction of Q8, the base-emitter junction of Q9, R3, R4, the base-emitter junction of Q13, and the base-emitter junction of Q12, such that Early effect-induced errors that might otherwise arise when the input stage's common mode input voltage changes are reduced.

20. The input stage of claim 19, wherein said input stage is arranged such that $V_{be(Q8)} + V_{be(Q9)} + I^*R3 = I^*R4 + V_{be(Q13)} + V_{be(Q12)}$ such that the collector voltage of said first current source transistor is approximately equal to the collector voltage of said second current source transistor.

* * * * *